(12) United States Patent
Huang et al.

(10) Patent No.: US 11,632,088 B2
(45) Date of Patent: Apr. 18, 2023

(54) VOLTAGE CONVERTER AND CLASS-D AMPLIFIER

(71) Applicant: Elite Semiconductor Microelectronics Technology Inc., Hsinchu (TW)

(72) Inventors: Yang-Jing Huang, Hsinchu (TW); Deng-Yao Shih, Hsinchu (TW); Ya-Mien Hsu, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 172 days.

(21) Appl. No.: 17/102,455

(22) Filed: Nov. 24, 2020

(65) Prior Publication Data

US 2022/0166394 A1    May 26, 2022

(51) Int. Cl.
*H03F 3/217* (2006.01)
*H03F 3/45* (2006.01)
*H03K 5/08* (2006.01)
*H02M 3/156* (2006.01)

(52) U.S. Cl.
CPC ............ *H03F 3/217* (2013.01); *H02M 3/156* (2013.01); *H03F 3/45076* (2013.01); *H03K 5/08* (2013.01); *H03F 2200/351* (2013.01)

(58) Field of Classification Search
CPC ................. H03F 3/217; H03F 3/45076; H03F 2200/351; H03F 3/183; H03F 3/2173; H02M 3/156; H03K 5/08; Y02B 70/10
See application file for complete search history.

(56) References Cited

U.S. PATENT DOCUMENTS

| | | | |
|---|---|---|---|
| 10,622,349 B2 | 4/2020 | Nagao | |
| 2007/0024261 A1* | 2/2007 | Wong | H02M 3/1588 323/288 |
| 2007/0103005 A1 | 5/2007 | Nagasawa | |
| 2016/0043642 A1* | 2/2016 | Xu | H02M 1/08 323/271 |

FOREIGN PATENT DOCUMENTS

| | | |
|---|---|---|
| CN | 102832810 B | 4/2015 |
| CN | 104485806 B | 7/2017 |
| CN | 106712501 B | 6/2019 |
| TW | I482402 B | 4/2015 |
| TW | I506904 B | 11/2015 |
| TW | I536725 B | 6/2016 |

* cited by examiner

*Primary Examiner* — John W Poos
*Assistant Examiner* — Tyler J Pereny
(74) *Attorney, Agent, or Firm* — Winston Hsu

(57) ABSTRACT

A voltage converter comprising: a bootstrap circuit, comprising an output capacitor, an error amplifier, a charging control circuit and a charging circuit. The charging control circuit comprises: a detection circuit, configured to detect an output voltage of the output capacitor to generate a detection signal; and a power limiting circuit, configured to clamp an output voltage of the error amplifier to a specific range based on the detection signal. The charging circuit is configured to generate a charging signal according the output voltage of the error amplifier to the bootstrap circuit, to charge the output capacitor.

18 Claims, 4 Drawing Sheets

VOLTAGE CONVERTER AND CLASS-D AMPLIFIER

BACKGROUND OF THE INVENTION

1. Field of the Invention

The present invention relates to a voltage converter and a class-D amplifier, and particularly relates to a voltage converter and a class-D amplifier which can avoid loop being broken while compensating the leakage of an output capacitor.

2. Description of the Prior Art

A conventional voltage converter may have a bootstrap circuit with an output capacitor. However, during operation, the voltage of the output capacitor may be consumed by pre-drivers and becomes too low. Such situation may induce false operation of the bootstrap circuit.

SUMMARY OF THE INVENTION

Therefore, one objective of the present invention is to provide a voltage converter which can avoid loop being broken while compensating the leakage of an output capacitor.

Another objective of the present invention is to provide a D-class amplifier which can avoid loop being broken while compensating the leakage of an output capacitor.

One embodiment of the present invention discloses a voltage converter comprising: a bootstrap circuit, comprising an output capacitor, an error amplifier, a charging control circuit and a charging circuit. The charging control circuit comprises: a detection circuit, configured to detect an output voltage of the output capacitor to generate a detection signal; and a power limiting circuit, configured to clamp an output voltage of the error amplifier to a specific range based on the detection signal. The charging circuit is configured to generate a charging signal according the output voltage of the error amplifier to the bootstrap circuit, to charge the output capacitor.

Another embodiment of the present invention discloses a class-D amplifier comprising: an output circuit comprising an output capacitor, an error amplifier, a charging control circuit and a charging circuit. The charging control circuit comprises: a detection circuit, configured to detect an output voltage of the output capacitor to generate a detection signal; and a power limiting circuit, configured to clamp an output voltage of the error amplifier to a specific range based on the detection signal. The charging circuit is configured to generate a charging signal according the output voltage of the error amplifier to the output circuit, to charge the output capacitor.

In view of above-mentioned embodiments, the voltage converter provided by the present invention can compensate the leakage issue without directly pulling down the output voltage, thus can avoid loop being broken while compensating the leakage of an output capacitor.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Also, the term "first", "second", "third" in following descriptions are only for the purpose of distinguishing different one elements, and do not mean the sequence of the elements. For example, a first device and a second device only mean these devices can have the same structure but are different devices.

Figure 1:
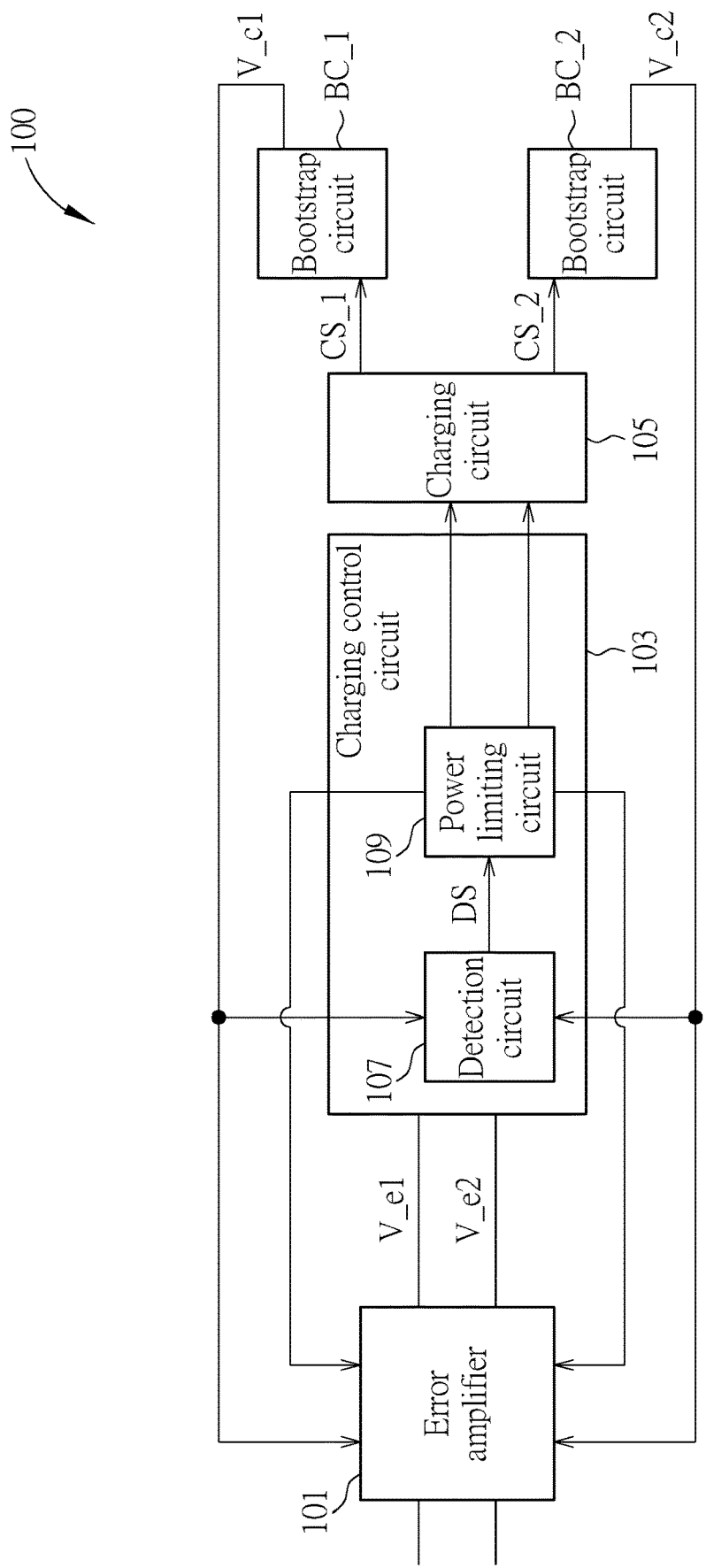
FIG. 1 is a block diagram illustrating a voltage converter according to one embodiment of the present invention.

FIG. 1 is a block diagram illustrating a voltage converter 100 according to one embodiment of the present invention. As illustrated in FIG. 1, the voltage converter 100 comprises an error amplifier 101, a charging control circuit 103, a charging circuit 105 and bootstrap circuits BC_1, BC_2. The charging control circuit 103 further comprises a detection circuit 107 and a power limiting circuit 109. Please note, in following embodiments, the voltage converter 100 is a differential input/output circuit, thus have two bootstrap circuits BC_1, BC_2. However, the voltage converter 100 can be a single input/output circuit. In such case, the voltage converter 100 can have only one bootstrap circuit and other circuit structures can be correspondingly changed. Also, in following descriptions, only operations for one path of the voltage converter 100 are illustrated, for the convenience of explaining.

The bootstrap circuit BC_1 comprises an output capacitor (not illustrated in FIG. 1). The detection circuit 107 is configured to detect an output voltage $V\_c1$ of the output capacitor to generate a detection signal DS. The power limiting circuit 103 is configured to clamp an output voltage $V\_e1$ of the error amplifier 101 to a specific range based on the detection signal DS. In one embodiment, the specific range is a specific voltage level. The charging circuit 105 is configured to generate a charging signal $CS\_1$ according to the output voltage $V\_e1$, to charge the output capacitor. In one embodiment, the power limiting circuit 109 clamps the output voltage $V\_e1$ to the specific range such that the charging circuit 105 increases a frequency of charging the output capacitor, thereby a voltage of the output capacitor can be increased.

In one embodiment, the voltage converter 100 can work as a class-D amplifier. In such case, the boot strap circuit BC_1 can be regarded as an output circuit.

In following descriptions, the detail circuitries of the voltage converter 100 are described. It will be appreciated that these circuitries are only examples but do not mean to limit the scope of the present invention. Any circuitry which has the same function should also fall in the scope of the present invention.

Figure 2:
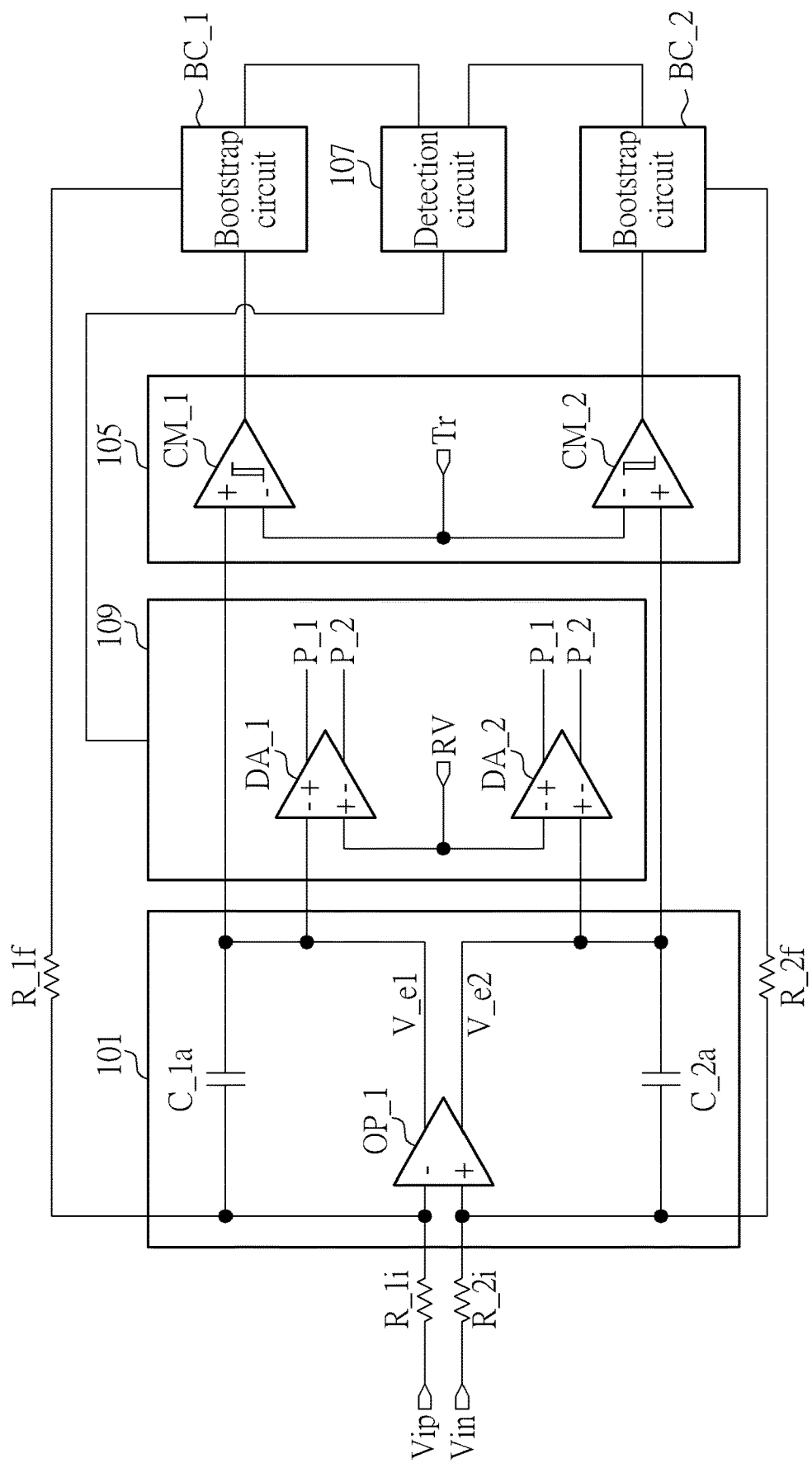
FIG. 2 is a circuit diagram illustrating detail structures of the voltage converter illustrated in FIG. 1 according to one embodiment of the present invention.

FIG. 2 is a circuit diagram illustrating detail structures of the voltage converter illustrated in FIG. 1 according to one embodiment of the present invention. As shown in FIG. 2, the error amplifier 101 comprises resistors $R\_1i$, $R\_2i$, capacitors $C\_1a$, $C\_2a$, and an operational amplifier OP_1.

Also, the charging circuit 105 is a PWM circuit comprising comparators CM_1, CM_2, which respectively comprises negative input terminals for receiving the triangular wave signal Tr and positive input terminals for receiving the outputs from the output voltage V_e1. Additionally, the power limiting circuit 109 comprises a differential amplifier DA_1, which comprising: a first input terminal, configured to receive the output voltage V_e1; a second input terminal, configured to receive a reference voltage RV (i.e. the above-mentioned specific voltage level); a first output terminal, configured to generate a first power limiting signal P_1 according to the output voltage V_e1 and the reference voltage RV; a second output terminal, configured to generate a second power limiting signal P_2 according to the output voltage V_e1 and the reference voltage RV. The error amplifier 101 receives the first power limiting signal P_1 and the second power limiting signal P_2 to generate the output voltage V_e1. In one embodiment, the negative input terminal of the operational amplifier OP_1 receives the second power limiting signal P_2 and the positive input terminal of the operational amplifier OP_1 receives the first power limiting signal P_1.

Figure 3:
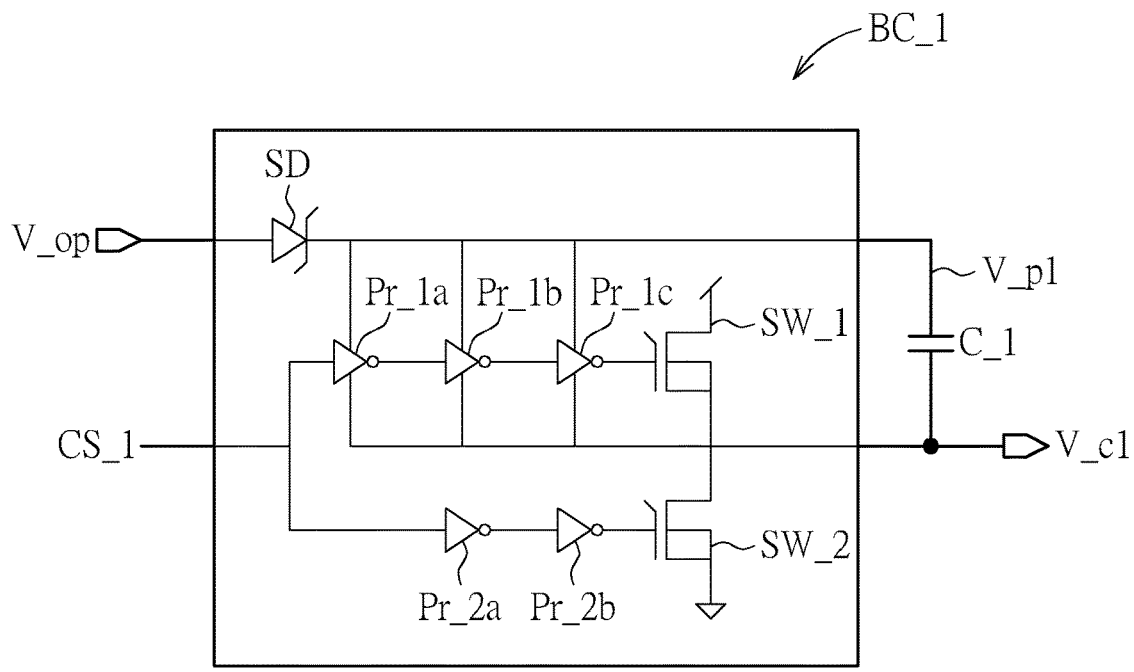
FIG. 3 is a circuit diagram illustrating detail structures of the boot strap circuit illustrating in FIG. 1 and FIG. 2, according to one embodiment of the present invention.
Figure 4:
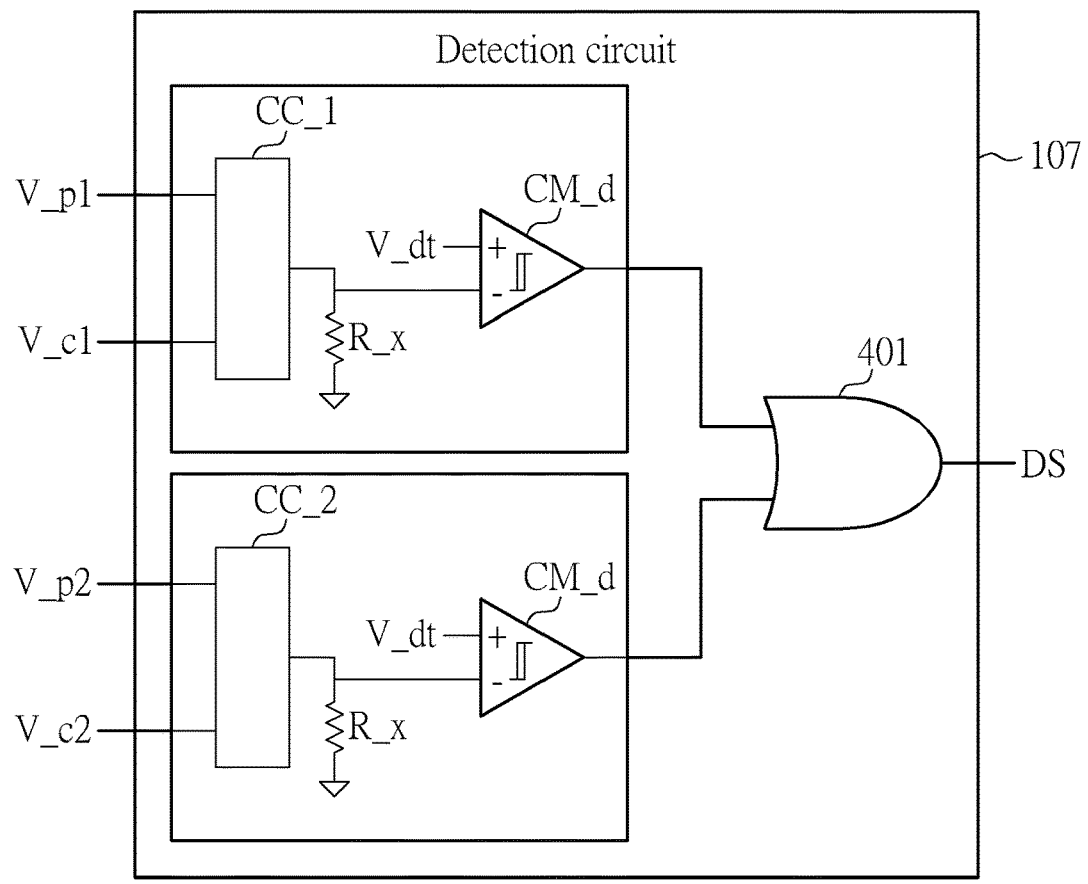
FIG. 4 is a circuit diagram illustrating detail structures of the detection circuit illustrating in FIG. 1 and FIG. 2, according to one embodiment of the present invention.

FIG. 3 is a circuit diagram illustrating detail structures of the boot strap circuit illustrating in FIG. 1 and FIG. 2, according to one embodiment of the present invention. Also, FIG. 4 is a circuit diagram illustrating detail structures of the detection circuit illustrating in FIG. 1 and FIG. 2, according to one embodiment of the present invention. Please also refer to FIG. 2 while referring to FIG. 3 or FIG. 4 to understand the content of the present invention for more clarity.

As shown in FIG. 3, the bootstrap circuit BC_1 comprises an output capacitor C_1 (i.e., the above-mentioned output capacitor), switches SW_1, SW_2, pre-drivers Pr_1a, Pr_1b, Pr_1c, Pr_2a, Pr_2b and a schottky diode SD. The bootstrap circuit BC_1 operates at the operating voltage V_op and receives the charging signal CS_1 for controlling the switches SW_1 and SW_2 to be turned on (i.e., conductive) or turned off (i.e., non-conductive). The switch SW_1, and the pre-drivers Pr_a, Pr_1b, Pr_1c form a high side path. Besides, the switch SW_2, and the pre-drivers Pr_2a, Pr_2b form a low side path. As above-mentioned, the charging signal CS_1 can be a PWM signal. Therefore, in the embodiment of FIG. 3, the low side path is turned on (i.e., the switch SW_2 is turned on) and the high side path is turned off (i.e., the switch SW_1 is turned off) to charge the output capacitor C_1, if the charging signal CS_1 has a low logic value. On the opposite, the high side path is turned on but the low side path is turned off, such that the output capacitor C_1 is not charged and Vp 1 is boosted, if the charging signal CS_1 has a high logic value. The output capacitor C_1 may have leakage when it is charged, thus the voltage thereof may drop.

Please refer to FIG. 4, the detection circuit 107 comprises a comparator CM_d, which is configured to compare voltages at two terminals of the output capacitor C_1 (i.e., the output voltage V_c1 and the voltage V_p1 in FIG. 3) with a difference threshold voltage V_dt. Also, the detection circuit 107 comprises a logic circuit 401 (e.g. an OR gate), which is configured to generate the detection signal DS based on an output of the comparator CM_d. For more detail, the detection circuit 107 in FIG. 4 comprises a converting circuit CC_1, which is configured to convert a voltage difference between the voltages at two terminals of the output capacitor C_1 to a current. After that, the resistor R_x generates the voltage difference according to the current. It will be appreciated that the detection circuit 107 is not limited to compare voltages at two terminals of the output capacitor C_1 to detect whether the output capacitor C_1 has leakage or not. For example, the detection circuit 107 can compare the output voltage V_c1 with a standard voltage, and determines the output capacitor C_1 has leakage when the output voltage V_c1 is smaller than the standard voltage.

Figure 5:
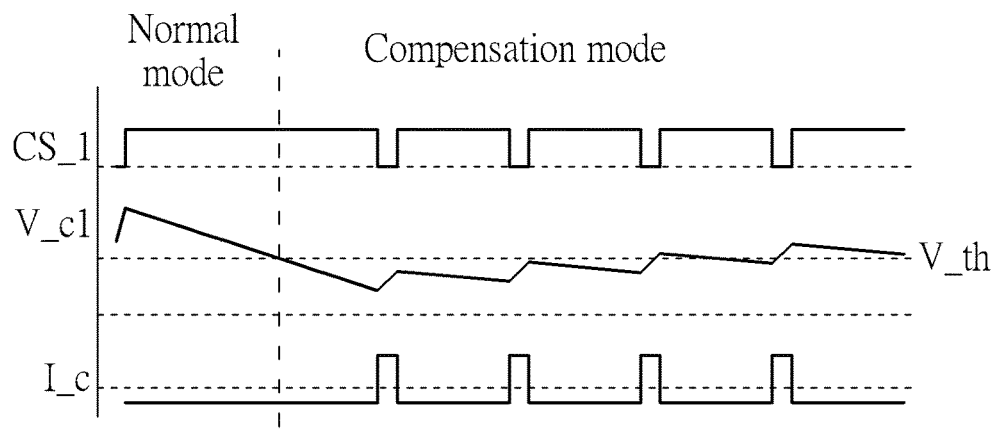
FIG. 5 and FIG. 6 are schematic diagrams illustrating operations of the circuit illustrated in FIG. 1 and FIG. 2, according to one embodiment of the present invention.
Figure 6:
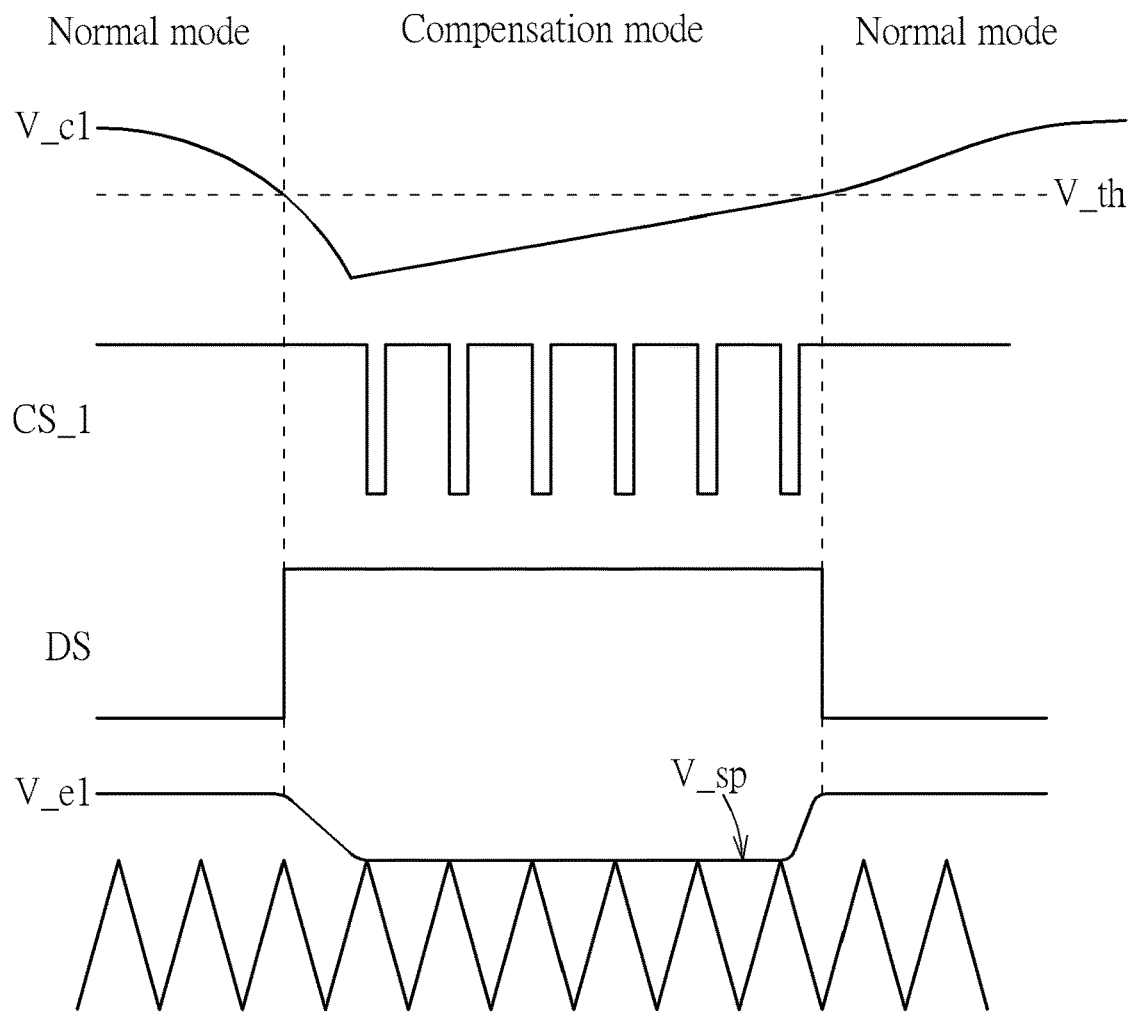

FIG. 5 and FIG. 6 are schematic diagrams illustrating operations of the circuit illustrated in FIG. 1 and FIG. 2, according to one embodiment of the present invention. FIG. 5 illustrates the relations between the voltage V_c1 across the capacitor C_1, the charging signal CS_1 and the charging current I_c. As shown in FIG. 5, the voltage converter 100 operates in a normal mode when the voltage V_c1 across the capacitor C_1 is larger than a threshold voltage V_th and the output capacitor C_1 is not charged. Also, the charging signal CS_1, which is a PWM signal, has a higher duty cycle in the normal mode (in this case, the duty cycle is 100%). Besides, the voltage converter 100 enters a compensation mode when the voltage V_c1 across the capacitor C_1 is smaller than the threshold voltage V_th. In the compensation mode, the charging signal CS_1 has a lower duty cycle. The output capacitor C_1 is charged when the charging signal CS_1 has a low logic value, via the charging current I_c. Therefore, the voltage V_c1 across the capacitor C_1 gradually increases in the compensation mode, until it is larger than the threshold voltage V_th. In one embodiment, the threshold voltage V_th is set to 0.5*V_op.

FIG. 6 illustrates the relations between the voltage V_c1 across the capacitor C_1, the charging signal CS_1, the detection signal DS and the output voltage V_e1 of the error amplifier 101. As illustrated in FIG. 6, in the normal mode, the voltage V_c1 across the capacitor C_1 is larger than the threshold voltage V_th, thus the charging signal CS_1 has a higher duty cycle and the detection signal DS has a low logic value. Also, in the normal mode, the output voltage V_e1 of the error amplifier 101 is not suppressed. Additionally, if the voltage V_c1 across the capacitor C_1 is smaller than the threshold voltage V_th, the voltage converter 100 enters the compensation mode. In the compensation mode, the charging signal CS_1 has a lower duty cycle and the detection signal DS has a high logic value. Also, in the compensation mode, the output voltage V_e1 of the error amplifier 101 is suppressed to the specific voltage level V_sp, to decrease the duty cycle of the charging signal CS_1.

In one embodiment, the specific voltage level V_sp is determined by following Equation:

$$V\_sp = V\_Ltri + (1 - D\_max) \times \frac{V\_Htri}{100\%}$$

The V_Ltri is a bottom voltage of the triangular wave signal Tr which is used by the charging circuit 105 to generate the PWM signal. Also, the V_Htri is an upper voltage of the triangular wave signal Tr. Besides, the duty cycle of the charging signal CS is decreased to be smaller than D_max in the compensation mode. In one embodiment, the D_max is $$\frac{I\_c}{I\_c + I\_d}.$$

I_c is a charge current of the output capacitor C_1 while the output capacitor is being charged. The I_c equals to the schottky diode SD in FIG. 3 in one embodiment. Also, I_d is a discharging current while the output capacitor is not charged. In one embodiment, the I_d could be the leakage current of the schottky diode SD, the switching loss current of the pre-drivers Pr_1a, Pr_1b, Pr_1c during transition, or the junction leakage current at the node V_p1 in FIG. 3.

In view of above-mentioned embodiments, the voltage converter provided by the present invention can compensate the leakage issue without directly pulling down the output voltage, thus can avoid loop being broken while compensating the leakage of an output capacitor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage converter, comprising:
   a bootstrap circuit, comprising an output capacitor;
   an error amplifier;
   a charging control circuit, comprising:
     a detection circuit, configured to detect a voltage of the output capacitor to generate a detection signal; and
     a power limiting circuit, configured to clamp an output voltage of the error amplifier to a specific range based on the detection signal;
     wherein the power limiting circuit receives the output voltage of the error amplifier to generate at least one power limiting signal;
     wherein the error amplifier receives the power limiting signal to generate the output voltage; and
   a charging circuit, configured to generate a charging signal according to the output voltage of the error amplifier to the bootstrap circuit, to charge the output capacitor.

2. The voltage converter of claim 1, wherein the power limiting circuit clamp the output voltage of the error amplifier to the specific range such that the charging circuit increases a frequency of charging the output capacitor.

3. The voltage converter of claim 1, wherein the charging circuit is a PWM circuit and the charging signal is a PWM signal, wherein the power limiting circuit clamps the output voltage of the error amplifier to the specific range such that a duty cycle of the charging signal is decreased.

4. The voltage converter of claim 3, wherein the duty cycle is decreased to be smaller than $$\frac{I\_c}{I\_c+I\_d},$$

wherein I_c is a charge current of the output capacitor while the output capacitor is being charged and the I_d is a discharging current while the output capacitor is not charged.

5. The voltage converter of claim 3,
   wherein the bootstrap circuit comprises a high side path and a low side path;
   wherein the low side path is turned on to charge the output capacitor but the high side path is turned off, if the charging signal has a low logic value;
   wherein the high side path is turned on but the low side path is turned off, if the charging signal has a high logic value.

6. The voltage converter of claim 1, wherein the power limiting circuit comprises:
   a differential amplifier, comprising:
     a first input terminal, configured to receive the output voltage;
     a second input terminal, configured to receive a reference voltage;
     a first output terminal, configured to generate a first power limiting signal according to the output voltage and the reference voltage; and
     a second output terminal, configured to generate a second power limiting signal according to the output voltage and the reference voltage;
   wherein the error amplifier receives the first power limiting signal and the second power limiting signal to generate the output voltage.

7. The voltage converter of claim 6, wherein the charging circuit is a PWM circuit comprising at least one comparator, wherein the comparator receives the output voltage and a triangular wave signal to generate the charging signal.

8. The voltage converter of claim 1, wherein the detection circuit comprises:
   a comparator, configured to compare voltages at two terminals of the output capacitor with a difference threshold voltage; and
   a logic circuit, configured to generate the detection signal based on an output of the comparator.

9. The voltage converter of claim 1, wherein the specific range is a specific voltage level.

10. A D-class amplifier, comprising:
    an output circuit, comprising an output capacitor;
    an error amplifier;
    a charging control circuit, comprising:
      a detection circuit, configured to detect a voltage of the output capacitor to generate a detection signal; and
      a power limiting circuit, configured to clamp an output voltage of the error amplifier to a specific range based on the detection signal;
      wherein the power limiting circuit receives the output voltage of the error amplifier to generate at least one power limiting signal to the error amplifier;
      wherein the error amplifier receives the power limiting signal to generate the output voltage; and
    a charging circuit, configured to generate a charging signal according the output voltage of the error amplifier to the output circuit, to charge the output capacitor.

11. The D-class amplifier of claim 10, wherein the power limiting circuit clamp the output voltage of the error amplifier to the specific range such that the charging circuit increases a frequency of charging the output capacitor.

12. The D-class amplifier of claim 10, wherein the charging circuit is a PWM circuit and the charging signal is a PWM signal, wherein the power limiting circuit clamps the output voltage of the error amplifier to the specific range such that a duty cycle of the charging signal is decreased.

13. The D-class amplifier of claim 12, wherein the duty cycle is decreased to be smaller than $$\frac{I\_c}{I\_c+I\_d},$$

wherein I_c is a charge current of the output capacitor while the output capacitor is being charged and the I_d is a discharging current while the output capacitor is not charged.

14. The D-class amplifier of claim 12,
wherein the output circuit comprises a high side path and a low side path;
wherein the low side path is turned on to charge the output capacitor but the high side path is turned off, if the charging signal has a low logic value;
wherein the high side path is turned on but the low side path is turned off, if the charging signal has a high logic value.

15. The D-class amplifier of claim 10, wherein the power limiting circuit comprises:
a differential amplifier, comprising:
a first input terminal, configured to receive the output voltage;
a second input terminal, configured to receive a reference voltage;
a first output terminal, configured to generate a first power limiting signal according to the output voltage and the reference voltage; and
a second output terminal, configured to generate a second power limiting signal according to the output voltage and the reference voltage;
wherein the error amplifier receives the first power limiting signal and the second power limiting signal to generate the output voltage.

16. The D-class amplifier of claim 15, wherein the charging circuit is a PWM circuit comprising at least one comparator, wherein the comparator receives the output voltage and a triangular wave signal to generate the charging signal.

17. The D-class amplifier of claim 10, wherein the detection circuit comprises:
a comparator, configured to compare voltages at two terminals of the output capacitor with a difference threshold voltage; and
a logic circuit, configured to generate the detection signal based on an output of the comparator.

18. The D-class amplifier of claim 10, wherein the specific range is a specific voltage level.

* * * * *